United States Patent [19]

Reimer

[11] Patent Number: 4,633,176
[45] Date of Patent: Dec. 30, 1986

[54] TEST FIXTURE INCLUDING DEFLECTABLE PROBES
[75] Inventor: William A. Reimer, Wheaton, Ill.
[73] Assignee: GTE Communication Systems Corp., Northlake, Ill.
[21] Appl. No.: 622,520
[22] Filed: Jun. 20, 1984
[51] Int. Cl.[4] .................. G01R 31/22; G01R 15/12
[52] U.S. Cl. ........................ 324/158 P; 324/158 F; 324/73 PC
[58] Field of Search ............ 324/158 F, 158 P, 158 R, 324/73 PC; 339/108 TP, 17 LM, 17 M

[56] References Cited
U.S. PATENT DOCUMENTS 2,972,728  2/1961  Cole .............................. 339/252 R
3,676,776  7/1972  Bauer et al. ................... 324/158 P X
4,164,704  8/1979  Kato et al. .................... 324/158 F X
4,535,536  8/1985  Wyss ............................ 324/73 P C X Primary Examiner—Ernest F. Karlsen
Assistant Examiner—Vinh P. Nguyen
Attorney, Agent, or Firm—Gregory G. Hendricks

[57] ABSTRACT

A test fixture including deflectable test probes employing flexible members attaching a probe head to a probe shaft, the probe head engaging a locating aperture to deflect the probe head to a printed wiring board test point not in alignment with the test probe axis. The test probe head may be of conical shape and include a plurality of ribs spaced along an outer surface thereof to reduce friction. The probe head may include a tip which is rounded to reduce test point damage or optionally pointed to achieve fine test point contacting resolution.

14 Claims, 6 Drawing Figures

TEST FIXTURE INCLUDING DEFLECTABLE PROBES

BACKGROUND OF THE INVENTION

The present invention relates to test fixtures and, more particularly, to a printed wiring board test fixture employing probes positioned in a grid which are individually deflectable in one of a number of directions by a probe deflecting template.

Printed wiring board test fixtures are very well known to those skilled in the art. One very common type is taught in U.S. Pat. No. 3,551,807 issued Dec. 29, 1970 to Walter Kulischenko et al. and U.S. Pat. No. 4,251,772 issued Feb. 17, 1981 to Daniel A. Worsham et al. which teaches a repositionable probe having separate controls in a radial direction and angular direction by means of a cammed screw (first cited patent) or a joystick (second cited patent). Such arrangements while operating generally satisfactorily have been found inappropriate in an environment containing a large number of closely spaced test points positioned in an array or matrix such as a "bed of nails" test fixture for printed wiring boards.

Another method of accessing test points positioned within a matrix is taught in U.S. Pat. No. 3,654,585 issued Apr. 4, 1972 to Price D. Wickersham in which an array of spring contact elements are arranged in a matrix on a uniform rectangular grid and, through a coordinate conversion interface, provide access to random-arranged contact points of a single or multi-layer printed circuit board for the purpose of conducting electrical tests. The coordinate conversion interface comprises a base plate provided with contact pads on one side having the same random arrangement as the board contact points and corresponding pads on the opposite side positioned at points coincident with the spring pin contact elements. Corresponding pads on each of the two sides are interconnected to electrically connect the spring contact elements to the randomly arranged contact points of the printed wiring board being tested.

Such an arrangement, while operating generally satisfactorily, requires the development of a unique interface conversion board for each printed wiring board being tested and additionally, creates two contact interfaces to each printed wiring board test point being accessed thereby increasing circuit path contact resistance and decreasing connection reliability in the presence of contact contamination.

Yet another method of accessing test points on a printed wiring card is described in U.S. Pat. No. 4,164,704 issued Aug. 14, 1979 to Makoto Kato et al. which teaches a test fixture for circuit cards having a probe board bearing electrical test probes in a fixed position with respect to the overlaying test surface. A flexible sheet is supported by the probe heads and serves to stabilize their relative positions. Such an arrangement while operating generally satisfactorily requires relocating of the test probes on the probe board and installation of a unique flexible sheet for each printed wiring board tested.

SUMMARY OF THE INVENTION

The present invention overcomes the above problems by providing a new and improved arrangement for accessing test points on a printed wiring board employing a plurality of test probes each including a deflectable head. The test fixture in accordance with the present invention includes a printed wiring board including a first surface with a plurality of test points formed thereon. A frame is included to hold the wiring board and a test probe mounting plate is included, movably attached to the frame, the mounting plate parallel to the printed wiring board, proximate to the printed wiring board surface and movable in a direction towards the printed wiring board. A plurality of test probes are attached to the mounting plate and each test probe extends perpendicular from the mounting plate in a direction toward the printed wiring board, the probes each attached in a predetermined location along a test probe axis. Each probe includes, a rigid probe mount attached to the mounting plate, the mount including a central bore including an axis parallel to the test probe axis, a probe shaft slidably positioned within said mount central bore and including a first end near the printed wiring board, the probe shaft springingly biased in a direction toward the printed wiring board. A probe test head is attached to the shaft first end and a flexible member is positioned between each probe shaft and corresponding test head, the flexible member resiliently positioning the head in alignment with the test probe axis. A probe locating template of planar construction is included and positioned between the printed wiring board and the probe mount. A plurality of apertures are formed in the template, each aperture associated with a corresponding test probe and having a central axis displaced from the probe axis whereby the mounting plate is moved in a direction toward the printed wiring board and the probe test heads are each deflected and engage a corresponding test point.

The test head may be of a conical shape and may optionally include a plurality of ridges spaced equidistantly about the conical surface, which ridges engage the template apertures to deflect the test probe head. The template apertures may be circular in cross-section and may be formed within the template to encompass the test probe axis and the point to be tested. Optionally, the test head may be of rectangular pyramidal shape. The test points may be each located in a corresponding row and column of a regular matrix and the probes may be attached in respective positions within a grid, the axis of each test probe positioned equidistant from a different group of four adjacent test points.

The aperture central axis may be parallel to the test probe axis and all apertures may be displaced from the test probe axis either a fixed predetermined distance or each aperture central axis may be displaced a variable predetermined distance from a corresponding test probe axis. The probe heads may include ribs which are rounded to reduce rib wear and probe tips which are rounded to prevent test point damage or pointed to achieve fine resolution in contacting test points.

BRIEF DESCRIPTION OF THE DRAWING

The various features, advantages and benefits of the test fixture in accordance with the present invention will be apparent from the following description taken in conjunction with the accompanying drawing in which.

DESCRIPTION OF THE PREFERRED EMBODIMENT

Figure 1:
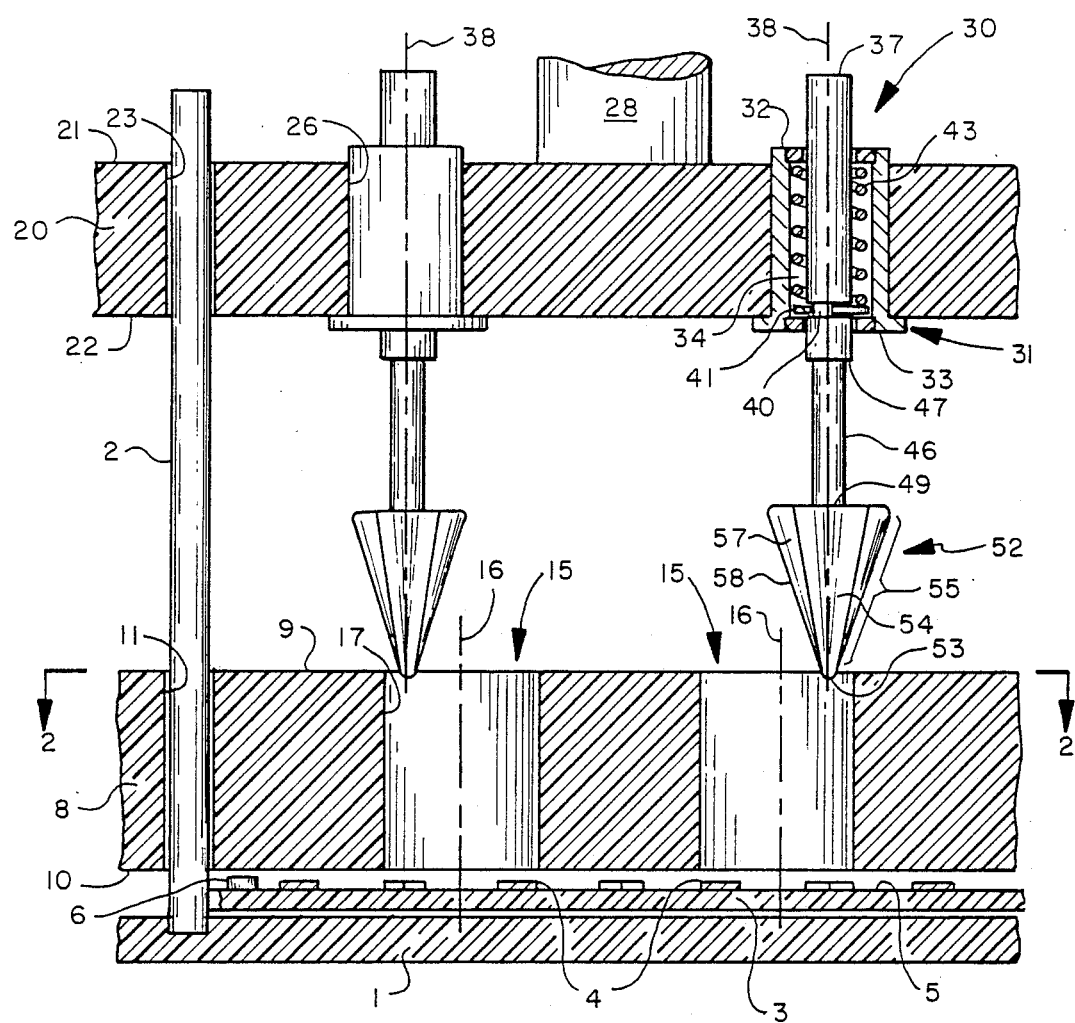
FIG. 1 is a diagonal elevation view along two diagonally adjacent test points taken along line 1 and 3 - 1 and 3 in FIG. 2.

Referring now to FIG. 1 there is shown a test fixture in accordance with the present invention. The fixture includes a frame 1 having an alignment column 2 attached thereto and extending perpendicularly therefrom in an upward direction. A printed wiring board 3 is included containing a plurality of test points 4 formed on an upper surface 5 thereof. A printed wiring board stop 6 is included and cooperates with the alignment column 2 to position the printed wiring board 3 within the test fixture of the present invention. A probe locating template 8 is included having an upper surface 9, a lower surface 10 and a plurality of alignment holes 11 formed between the upper surface 9 and lower surface 10. The alignment holes 11 engage the alignment column 2 to position the probe locating template 8 relative to the frame 1. The probe locating template 8 also includes a plurality of probe locating apertures 15 formed between the upper surface 9 and the lower surface 10 of the template 8. Each of the probe locating apertures 15 is of circular cross-section and includes a central axis parallel to the locating column 2.

A probe mounting plate 20 is included having an upper surface 21 and a lower surface 22, and a plurality of alignment apertures 23 formed between the upper surface 21 and the lower surface 22. The alignment apertures 23 engage the alignment column 2 in sliding relation. The test probe mounting plate 20 includes a plurality of test probe mounting apertures 26 formed in the plate 20 in a predetermined grid pattern. A force applying member 28 is attached to the upper surface 21 of the test probe mounting plate 20 and serves to apply force to the mounting plate to effect movement of the plate.

A plurality of test probes 30 are included and positioned within respective ones of the test probe mounting apertures 26 of the test probe mounting plate 20. Each of the test probes 30 includes a rigid probe mount 31 of hollow cylindrical construction including an upper guide ring 32 and a lower guide ring 33; the probe mount 31, the upper guide ring 32, and the lower guide ring 33 defining a spring receiving cavity 34 therein. The guide rings 32 and 33 may be assembled to a hollow cylinder to form the probe mount 31.

A probe shaft 37 of cylindrical construction is provided extending through the upper guide ring 32 and the lower guide ring 33. The probe shaft 37 is positioned along a test probe axis 38 which is perpendicular to the printed wiring board, and passes through the centers of the probe mounting aperture 26. The probe shaft 37 includes an annular groove 40 in which groove is located a shaft retaining clip 41. A spring 43 is included within the spring receiving cavity 34 between the shaft retaining clip 41 and the upper guide ring 32. The spring 43 may be of the compression type. A flexible member 46 is included attached to a lower end 47 of the probe shaft 37 and extends therefrom in the direction of the test probe axis 38 toward the printed wiring board 3 and terminating at a lower end 49. A test head 52 is attached to the flexible member lower end 49.

The test head 52 may be of conical construction including a tip 53 and an outer surface 54. A plurality of ribs 57 may be formed on the outer surface 54 of the test head 52 longitudinally oriented. The ribs 57 include an outer edge 58 which may be rounded to reduce wear. The test head tip 53 may be rounded to prevent damage to the test points 4 or optionally may be pointed to achieve fine resolution in contacting test points. The test head 52 includes a body portion 55.

Figure 2:
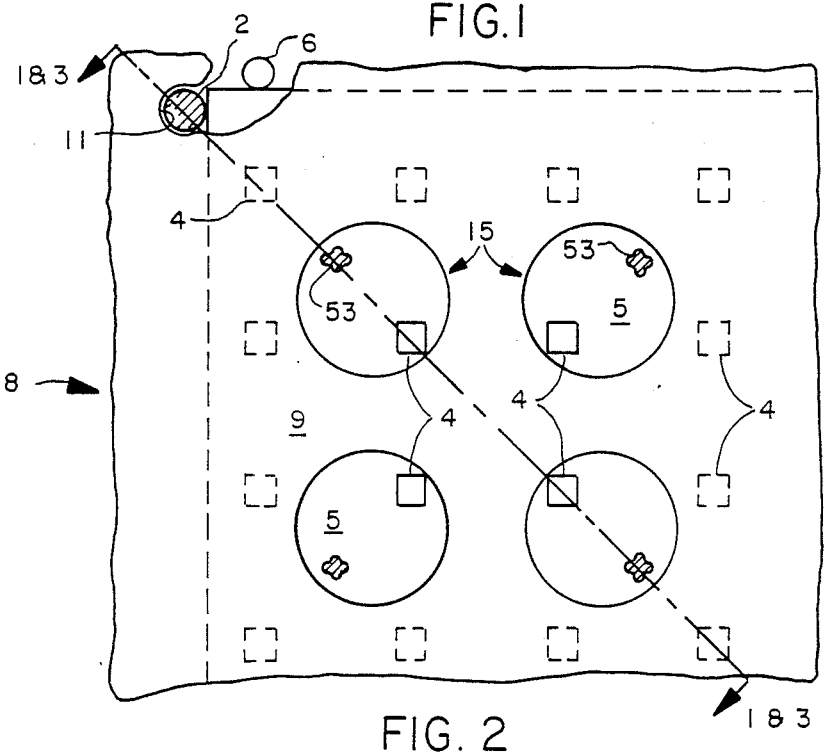
FIG. 2 is a top plan view of the test fixture taken along line 2—2 in FIG. 1.

Referring now to FIG. 2 there is shown a plan view of the present invention taken along the line 2—2 of FIG. 1. The tips 53 of the test heads 52 are shown partially engaged with the apertures 15 of the locating template 8. The test points 4 located on the upper surface 5 of the printed wiring board 3 may be seen through the apertures 15. The test points 4 are positioned within an array on the printed wiring boards upper surface 5. Several of the test points 4 have been shown in phantom line to depict the test point array arrangement.

Figure 3:
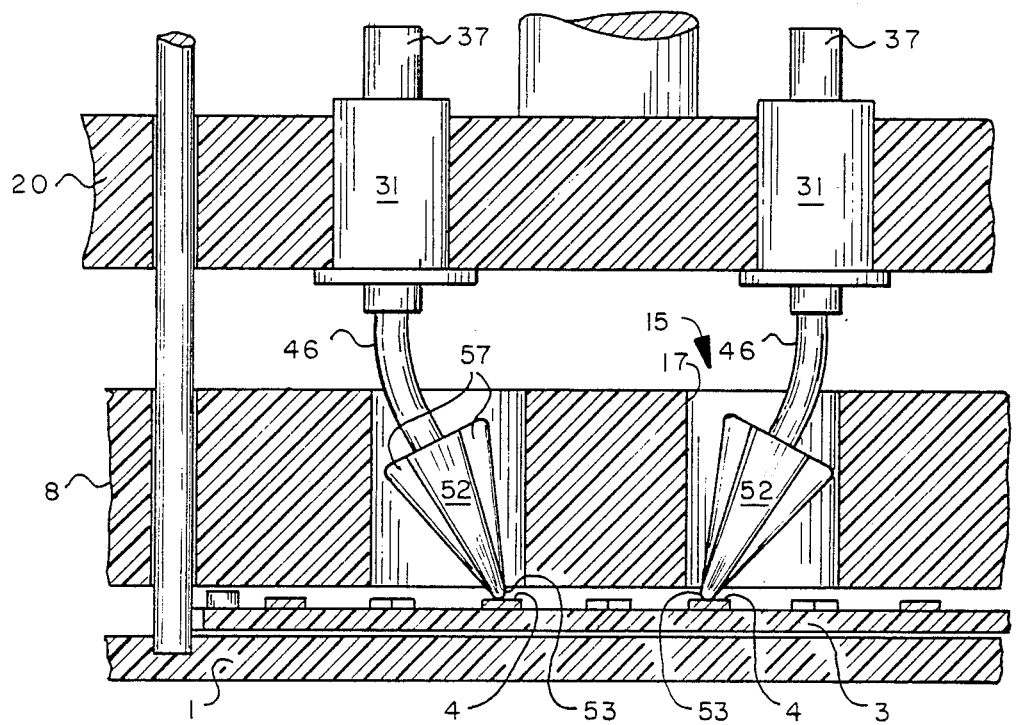
FIG. 3 diagonal elevation view of the test points in FIG. 1 shown in their operated positions.

The present invention is operated to connect the test probes 30 to corresponding ones of the test points 4 by orienting the printed wiring board 3 within the frame 1 of the present invention. In this regard, the printed wiring board 3 may be positioned against the alignment columns 2 and stops 6 for accuracy in positioning. A probe locating template 8 may then be positioned over the guide columns 2 and slid therealong in a downward direction to a point immediately above the printed wiring board 3. The test probe mounting plate 20 may then be positioned over the guide columns 2 and also slid therealong in a downward direction to position the test head tips 53 into engagement with the locating aperture 15. Force may then be applied to the probe mounting plate 20 by the force applying member 28 in a downward direction to engage the probe head 52 with the aperture wall 17 of the aperture 15. It should be noted here that the central axis 16 of the test probe apertures 15 are parallel to but spaced apart from the corresponding test probe axis 38. The displacement of the axis will cause the ribs 57 of the test head 52 to engage the aperture wall 17 and deflect the test head in the direction of the displacement of the aperture relative to the test probe axis. In accordance with the present invention, such displacement is in a direction toward the test point to which contact is being made. Following contact of the ribs 57 with the wall 17 of the aperture 15, continued application of force will deflect the test head 52 flexing the flexible member 46 and causing the test head tip 53 to contact the associated test point 4. See FIG. 3. It should be noted when viewing FIG. 3 that the ribs 57 closest the test point axis 38 (not shown) are in contact with the wall 17 of the locating aperture 15. The ribs 57 do not touch the edge of the aperture 15 in the drawing because in this figure they project out of and into the plane of the drawing at corresponding 45° angles.

Figures 4A, 4B, 4C:
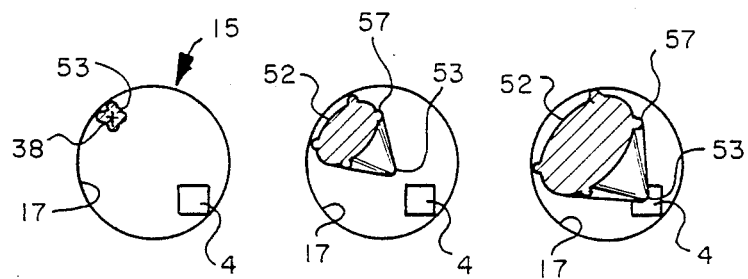
FIGS. 4A–4C are top plan views of a test probe head being deflected to a test point by a template aperture.

FIGS. 4A–4C include three plan views of a test head engaging and being deflected by the walls 17 of a probe locating aperture 15. In this regard, the first representation, FIG. 4A, shows the test head tip 53 engaged with the wall 17 of the probe locating aperture 15 but without being deflected from the test probe axis 38. Seen through the aperture 15 is the target test point 4. The second representation, FIG. 4B, shows the test head 52 partially engaged with the probe locating aperture 15 and partially deflected in a direction towards the test point 4. The third representation, FIG. 4C, shows the test head 52 fully deflected by action of the ribs 57 against the wall 17 of the aperture 15 and the probe tip 53 contacting the printed wiring board test point 4.

The test heads 52 of the test probes 30 may be disengaged from the test points 4 of the printed wiring board 3 by applying force to the member 28 in a direction away from the printed wiring board 3. The force thus applied will move the test probe mounting plate 20 away from the printed wiring board 3 removing the test heads 52 from engagement with the locating apertures 15 thereby removing the tips 53 from contact with the terminals 4 and restoring the heads 52 to their initial position in alignment with the test probe axis 38.

It will now be apparent that a test fixture including deflectable probes has been described hereinabove which offers significant advantages over prior art assemblies. The assembly by virtue of flexible members attaching the probe head to the probe shaft, and engaging the probe head within probe locating apertures permits deflection of the test probe tips to test points not coincident with the axis of the test probe, the deflection is controlled solely by the positioning of the apertures within the probe locating template.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A fixture for use in a printed wiring board test system, comprising:
    a printed wiring board including a first side surface;
    a plurality of test points formed on said printed wiring board first surface;
    a frame for holding said printed wiring board, said board positioned within said frame;
    a test probe mounting plate movably attached to said frame, said mounting plate parallel to said printed wiring board, proximate to said printed wiring board side surface, and movable in a direction toward said printed wiring board;
    a plurality of test probes attached to said mounting plate and extending perpendicularly therefrom in a direction toward said printed wiring board, said probes each attached in a predetermined location along a test probe axis perpendicular to said printed wiring board, each probe including
        a rigid probe mount attached to said mounting plate said mount including a central bore including an axis parallel to said test probe axis,
        a probe shaft, said shaft slidably positioned within said mount central bore, including a first end near said printed wiring board,
        a probe test head attached to said shaft first end,
        a flexible member positioned intermediate each said probe shaft and said test head, said member resiliently positioning said head in alignment with said test probe axis,
    a probe locating template of planar construction positioned intermediate said printed wiring board and said probe mount,
    a plurality of apertures formed in said template, each aperture associated with a corresponding test probe and having a central axis displaced from said test probe axis,
    whereby said mounting plate is moved in a direction toward said printed wiring board and said probe test heads are deflected and engage a corresponding one of said test points.

2. A fixture as claimed in claim 1, wherein: said test head is of conical shape.

3. A fixture as claimed in claim 2, wherein: said test head includes a plurality of ridges spaced equidistantly about said conical surface and which engage said aperture to deflect said test head.

4. A fixture as claimed in claim 1, wherein: said aperture is of circular cross-section.

5. A fixture as claimed in claim 4, wherein: said aperture encompasses said test point and said corresponding test probe axis.

6. A fixture as claimed in claim 1, wherein: said test head is of rectangular pyramidal shape.

7. A fixture as claimed in claim 1, wherein: said test points are each located on a corresponding row and column of a matrix and said test probes are attached to said mounting plate in a grid, said test probe axis of each probe positioned equidistant from a different group of four adjacent test points.

8. A fixture as claimed in claim 1, wherein: said aperture central axis is parallel to said corresponding test point axis.

9. A fixture as claimed in claim 1, wherein: said apertures are all displaced from said test probe axis a fixed predetermined distance.

10. A fixture as claimed in claim 1, wherein: said apertures are each displaced from said test probe axis a variable predetermined distance.

11. A fixture as claimed in claim 3, wherein: said plurality of ridges is greater than 3 and less than 5.

12. A fixture as claimed in claim 1, wherein: said probe head includes a plurality of ribs each including an outer edge, each of said outer edges rounded to reduce rib wear.

13. A fixture as claimed in claim 1, wherein: said test probe head includes a tip, said tip rounded to prevent test point damage.

14. A fixture as claimed in claim 1, wherein: said probe head includes a tip, said tip pointed to achieve fine test point contacting resolution.

* * * * *